United States Patent
Mühe

(10) Patent No.: US 7,662,231 B2
(45) Date of Patent: Feb. 16, 2010

(54) CORD ROTATING HEAD FOR A CRYSTAL DRAWING SYSTEM

(75) Inventor: Andreas Mühe, Wetzlar (DE)

(73) Assignee: Crystal Growing Systems GmbH, Asslar (DE)

( * ) Notice: Subject to any disclaimer, the term of this patent is extended or adjusted under 35 U.S.C. 154(b) by 0 days.

(21) Appl. No.: 10/592,262

(22) PCT Filed: Mar. 11, 2005

(86) PCT No.: PCT/DE2005/000461

§ 371 (c)(1),
(2), (4) Date: Aug. 20, 2007

(87) PCT Pub. No.: WO2005/087985

PCT Pub. Date: Sep. 22, 2005

(65) Prior Publication Data

US 2008/0000415 A1    Jan. 3, 2008

(30) Foreign Application Priority Data

Mar. 11, 2004   (DE) ...................... 10 2004 011 901

(51) Int. Cl.
*C30B 35/00* (2006.01)
(52) U.S. Cl. .................. 117/217; 117/200; 117/208; 117/216; 117/218; 117/222; 117/900
(58) Field of Classification Search ................. 117/200, 117/208, 216, 217, 218, 222, 900
See application file for complete search history.

(56) References Cited

U.S. PATENT DOCUMENTS

| | | | |
|---|---|---|---|
| 4,190,630 A | 2/1980 | Apilat et al. | 422/249 |
| 4,367,199 A | 1/1983 | Jericho | 422/110 |
| 4,663,128 A | 5/1987 | Helgeland | 422/249 |

FOREIGN PATENT DOCUMENTS

| | | |
|---|---|---|
| DE | 37 33 562 | 4/1989 |
| DE | 43 29 283 | 3/1995 |
| DE | 199 32 026 | 1/2001 |
| DE | 100 07 265 | 8/2001 |
| EP | 0 437 775 | 3/1995 |

*Primary Examiner*—Felisa C Hiteshew
(74) *Attorney, Agent, or Firm*—Ballard Spahr LLP

(57) ABSTRACT

The invention relates to the production of a cable rotating head, which is devoid of an abrasion ring, for a Czochralski-crystal drawing system which is used to drive a drawing cord in an azimuthal and vertical manner and the nucleus of a crystal is fixed therein. According to the invention, the cord rotating head comprises a cord winding mechanism which can be supported by a vertical hollow shaft, through which the drawing cord is suspended in the crystal drawing system, and the cord rotating head is rotationally mounted about the axis thereof and can be offset by a rotation motor, which is secured to the crystal drawing system, together with the cord winding mechanism and the drawing cord in a rotational movement, and said vertical hollow shaft is surrounded in a coaxial manner by a double toothed gear which is rotationally mounted opposite to the hollow shaft and can be driven by a drawing motor which is secured to the crystal drawing system. The double toothed gear can be driven by a gear of the cord winding mechanism, such that the mechanical drive energy of the drawing motor, which is secured in a stationary manner to the crystal drawing system, can be transferred to the cord winding mechanism which rotates in relation to the crystal drawing system.

9 Claims, 2 Drawing Sheets

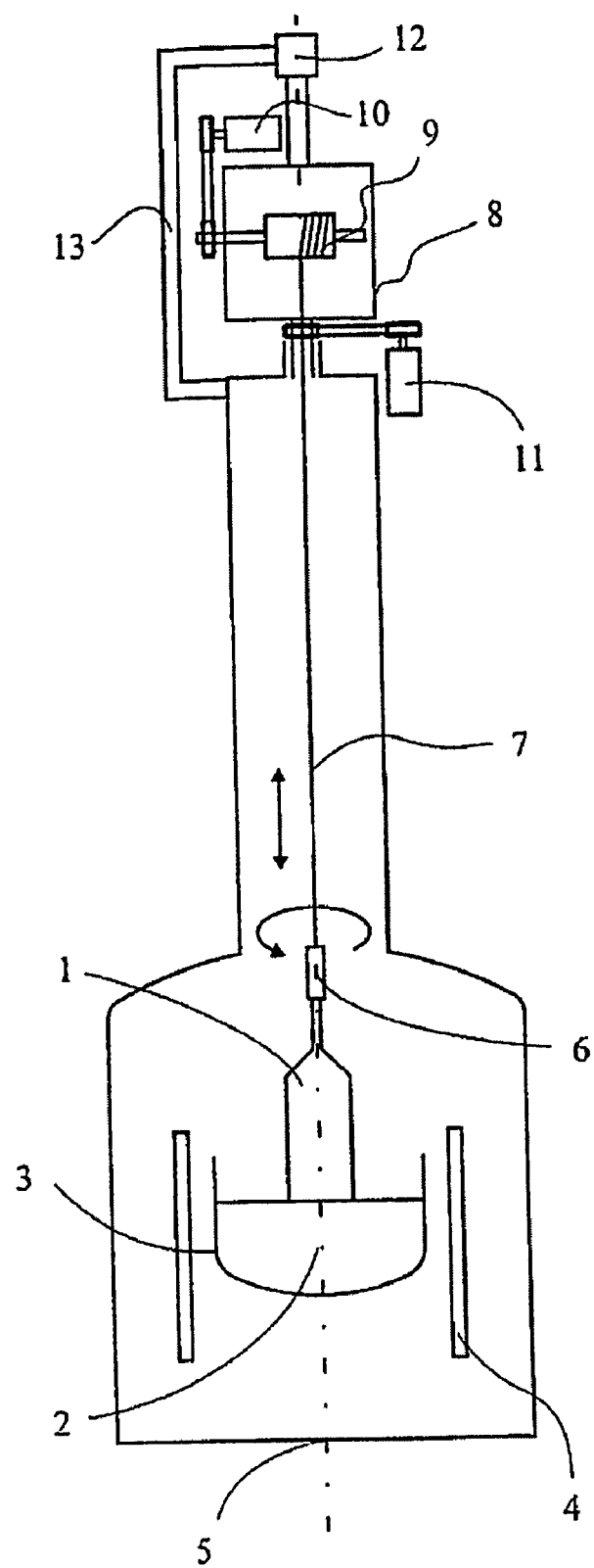
*Fig 2.        State of the Art*

CORD ROTATING HEAD FOR A CRYSTAL DRAWING SYSTEM

CROSS REFERENCE TO RELATED APPLICATIONS

The present application is a National Phase Application of International Application No. PCT/DE2005/999461, filed Mar. 11, 2005, which claims priority to German Patent Application No. 10 2004 011 901.5 filed Mar. 11, 2004, which applications are incorporated herein fully by this reference.

The present invention relates to a cable rotating head for a crystal pulling system, which is rotatable around a vertical axis of rotation using a rotation motor situated in a stationary manner on the crystal pulling system, whereby a cable winding mechanism, which is driven by a pulling motor via a transmission, is installed in the cable rotating head and is used to vertically move a pulling cable suspended in the vertical axis.

Such a cable rotating head having a cable winding mechanism, which is used in a Czochralski crystal pulling system, is described in DE 100 07 265, DE 43 29 283, EP 437 775, and U.S. Pat. No. 4,367,199. Reference is made to FIG. 2 for the following explanation in greater detail of the prior art. A cable winding mechanism is schematically illustrated therein. Such a system is used to pull a crystal 1, such as a silicon monocrystal, upward from a melt 2, such as a silicon melt, which is located in the crucible 3, such as a quartz glass crucible. The crucible having the melt it is heated by a heating unit 4, such as an electrical resistance heater or an induction heater. The growing space is enclosed by a process chamber 5, which may be evacuated or filled or flushed using protective gas if needed.

The crystal is suspended on a seed crystal holder 6, which is in turn attached to a pulling cable 7, such as a stainless steel cable or a tungsten cable. At the beginning of the crystal growth, the seed crystal holder 6 is first lowered and the seed crystal is brought into contact with the melt 2. Subsequently, the seed crystal holder 6 is raised again slowly and in a controlled way, so that further material from the melt crystallizes on the seed crystal at the speed at which the seed crystal holder is pulled upward. Sinking of the melt level in the crucible 3 is often compensated for by slowly raising the crucible 3. To obtain an approximately cylindrical crystal 1, usually both the crystal 1 and also the cable 3 are set into rotation around their vertical axis during the crystal growth. Because of this process control, the cable rotating head 8 has the object of being able to both raise and lower the pulling cable 7 very precisely and also set it into rotation. This is achieved by a cable drum 9, which may be set into rotation via a transmission and a pulling motor 10 and thus winds or unwinds the pulling cable 7. The cable drum 9 is located together with its drive in a housing or on a platform, which may be set into rotation around the vertical axis of the pulling system using a rotation motor 11. Because of the rotation of the pulling drive around the vertical axis of the pulling system, the connection cable of the pulling motor 10 must be connected via slip rings 12, whose terminal, which does not rotate in relation to the system, is connected to the pulling system by a holder and cable channel 13.

The embodiment of a cable rotating head documented in the prior art, in which the pulling motor 10 rotates jointly with the cable drum 9 around the vertical axis of the pulling system, has the disadvantage that the pulling motor 10 may only be connected for electrical power supply and for detecting the motor speed and thus the lift velocity via slip rings 12. Such slip rings are based on a frictional electrical contact between a rotating pole element and a resting pole element, wear of the pole elements being unavoidable and, in addition, interference of the electrical signals transmitted via the slip rings being able to occur. Therefore, in currently known cable rotating heads, digital motor control units are installed directly in the rotating part of the cable rotating head, so that only digital databus signals and the supply voltage must still be transmitted via the slip rings. However, this results in a very large construction and a large rotating mass, combined with possible problems because of imbalance of the rotating part of the cable rotating head. The problem of the occurrence of wear and the necessity connected thereto of maintaining the slip rings 12 thus also may not be solved in this way.

The cited problems of power and signal transmission into the rotating part of the cable rotating head are solved in DE 199 32 026 by inductive coupling of electrical power and electrical signals from a resting induction coil into a coaxially situated induction coil which rotates with the cable rotating head. Alternatively, only the electrical power is transmitted inductively into the cable rotating head, while the signal communication occurs through an optical transmission link or a high-frequency transmission link. Slip rings may be completely dispensed with and both the problem of wear and the problem of freedom from interference of the transmitted signals may be solved. However, this solution is connected to a high technical outlay, particularly when implementing the data transmission, and therefore with high costs.

The present invention is thus based on the object of providing a simply constructed cable rotating head, which is cost-effective to implement, in which the above-mentioned problems do not occur.

According to the present invention, the object is achieved by a cable rotating head according to the preamble of claim 1, which has the further features that the pulling motor is also situated in a stationary manner on the crystal pulling system and the transmission between the pulling motor and the cable winding mechanism has a transmission element, whose axis of rotation corresponds to the vertical axis of rotation of the cable rotating head.

The main idea of the present invention is thus that the transmission element situated in the vertical axis maintains its position even during a rotation of the cable rotating head, so that the further elements of the transmission remain coupled to the transmission element independently of the angle of the cable rotating head. This allows the pulling motor to be situated in a stationary manner, which has the advantage that the electrical supply lines for the power supply and for the transmission of the control signals may be connected conventionally to the system controller. In particular, the necessity of using slip rings and the complex and costly measures for avoiding electrical interference as well as the maintenance outlay connected thereto are dispensed with. At the same time, the cable rotating head may be constructed very compactly and also does not need any technologically complex inductive power and signal transmission.

With such an arrangement of the transmission element, it must be noted, however, that when the cable rotating head is rotating, the element of the transmission following the transmission element unwinds on the transmission element and thus introduces a drive of the cable pulling system and thus a lift of the pulling cable. This may be prevented by a refinement of the present invention, according to which a system controller is provided which sets the drive movement of the pulling motor in such a way that the drive of the cable winding mechanism introduced by a rotation of the cable rotating head and the vertical movement of the pulling cable linked thereto are compensated for and a lift velocity of the pulling cable communicated to the system controller is achieved.

The information required for the controller is obtained by incremental transducers, to which both motors are coupled.

The pulling cable is typically guided through a hollow shaft, which carries the cable rotating head. With such an arrangement, the transmission element may best be mounted rotatably on the hollow shaft. The two motors may thus also be situated below the cable rotating head on the head of the crystal growing system, which results in a compact construction.

A simple embodiment of the transmission element is a double gearwheel having two sets of teeth lying one on top of another, the lower gearwheel being coupled to the output shaft of the pulling motor and the upper gearwheel being coupled to the driveshaft of the cable winding mechanism.

Great design freedom is obtained in the arrangement of the pulling motor and the transmission if the drive connection of the gearwheel to the output shaft and/or to the driveshaft has a toothed belt in each case.

The above-mentioned controller of the motors may be improved if at least one position sensor is provided for determining the cable lift.

In a crystal growing system, a seed crystal holder is provided at the end of the pulling cable. The position sensor may be implemented as a position end switch in the highest position of the holder.

The system controller is set up so that it is capable of ascertaining the particular current lift of the holder starting from this highest position of the holder, which is reached as established by the position end switch, and the signals of the incremental transducers.

BRIEF DESCRIPTION OF THE FIGURES

FIG. 2 is a schematic illustration of a prior art Czochralski crystal pulling machine.

Figure 1:
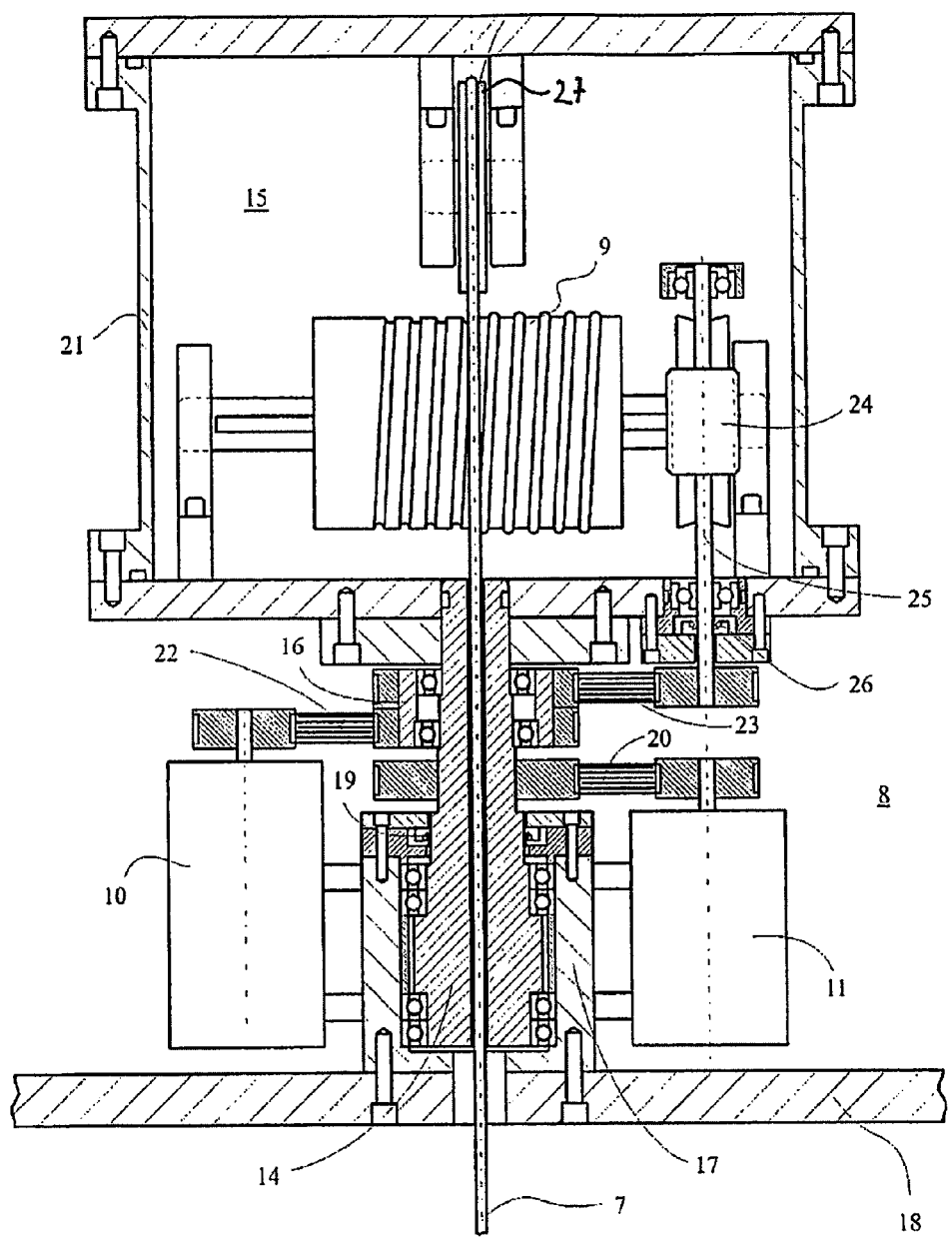
FIG. 1 is a partial cross-sectional elevational view of one embodiment of a crystal pulling machine.

An exemplary embodiment of the present invention will be described in greater detail on the basis of FIG. 1.

Reference is made to the statements above in regard to elements from the prior art, which have been described on the basis of FIG. 2 and are also present in the illustration of FIG. 1.

As shown in FIG. 1, a hollow shaft 14 is connected via a conventionally implemented rotatable mount 17 to the upper cover of the lock chamber 18 of the crystal pulling system. A vacuum-tight shaft bushing 19, having a radial shaft gasket or a ferrofluidic seal, for example, separates the atmosphere in the interior of the crystal pulling system from the surrounding atmosphere. The hollow shaft 14 is driven via a toothed belt 20 by a motor referred to as a rotation motor 11, such as a speed-regulated servomotor.

The cable winding mechanism 15, which is installed in a vacuum-tight, cylindrical housing 21, is installed on the hollow shaft 14. The hollow shaft 14 is coaxially enclosed by a gearwheel 16, also implemented as a hollow shaft, which is mounted so it is rotatable in relation to the first hollow shaft 14. The double gearwheel 16 is driven via a toothed belt 22 by a motor identified as a pulling motor 10, such as a speed-regulated servomotor. Simultaneously, the double gearwheel 16 transmits mechanical energy to the cable winding mechanism 15 via a toothed belt 23 when it is moved by the pulling motor 10 at a specific speed, which deviates from the speed of the hollow shaft 14.

The cable winding mechanism 15 comprises a horizontally situated cable drum 9, which is driven via a worm gear pair 24 by an auxiliary shaft 25, which is in turn driven via the toothed belt 23 by the double gearwheel 16. The auxiliary shaft 25 may be guided through a vacuum-tight shaft bushing 26, for example, having a radial shaft gasket or a ferrofluidic seal, into the vacuum-tight cylindrical housing 21. A toothed gearing may be used in each case instead of the toothed belts 20, 22, 23.

The pulling cable 7 running off of the cable drum 9 may be guided over a deflection roll 27 in order to achieve improved centering and adjustability of the entry point of the pulling cable 7 in the crystal pulling system. The cable drum 9 may also be situated vertically and may itself be driven via a toothed belt or a toothed gearing, however, at least one deflection roll then being necessary to deflect the pulling cable 7 running off of the cable drum 9 in a horizontal plane into the vertical direction.

To set the cable speed, i.e., the speed at which the pulling cable rotates around the vertical axis, in the embodiment described, only the motor speed of the rotation motor 11 and the transmission ratio of the toothed belt 20 are to be considered. To set the lift or lowering velocity of the pulling cable 7, in addition to the speed differential of the hollow shafts (hollow shaft 14, double gearwheel 16), the gear ratio of the toothed belt 23, the gear ratio of the worm gear pair 24, and the circumference of the cable drum 9 are to be considered.

To determine the speed differential of the hollow shafts 14, 16, the motor speed of the motors 10, 11 and the gear ratios of the toothed belts 20, 22 are to be considered. However, in known transmission gear ratios, the lift or lowering velocity of the pulling cable 7 may generally be calculated uniquely from the motor speed of the two motors 10, 11. Vice versa, at every cable speed the required motor speed of the pulling motor 10 may be calculated in order to reach the desired lift or lowering velocity of the pulling cable 7.

To achieve tracking of the vertical absolute position of the seed crystal holder 6, the axles of the motors 10, 11 may each be connected to an incremental transducer. The system controller then ascertains the angle covered by the motor shafts at fixed time intervals and calculates the path covered by the seed crystal holder 6 therefrom. Every time the system controller is turned on, a reference trip must then be performed with the cable lift to find a vertical reference position, the cable lift being activated until a reference switch, such as light barrier, is reached by the seed crystal holder 6.

LIST OF REFERENCE NUMERALS 1 crystal
2 melt
3 crucible
4 heating unit
5 process chamber
6 seed crystal holder
7 pulling cable
8 cable rotating head
9 cable drum
10 pulling motor
11 rotation motor
12 slip rings
13 cable channel
14 hollow shaft
15 cable winding mechanism
16 double gearwheel
17 mount
18 lock chamber 19 shaft bushing
20 toothed belt
21 cylindrical housing
22, 23 toothed belts
24 worm gear pair
25 auxiliary shaft
26 shaft bushing

The invention claimed is:

1. A cable rotating head for a crystal pulling system, comprising:
   a rotation motor positioned in a stationary manner on the crystal pulling system configured to rotate the cable rotating head about a vertical axis of rotation;
   a cable winding mechanism, comprising a pulling motor configured to vertically move a pulling cable axially along the vertical axis of rotation, wherein the pulling motor is positioned in stationary manner on the crystal pulling system; and
   a transmission operatively connected to the pulling motor and the cable winding system, the transmission comprising a transmission element configured to rotate about the vertical axis of rotation.

2. The cable rotating head of claim 1, further comprising a system controller for setting the drive movement of the pulling motor to compensate for the drive of the cable winding mechanism induced by a rotation of the cable rotating head and the vertical movement of the pulling cable linked thereto, and to achieve a lift velocity of the pulling cable.

3. The cable rotating head of claim 2, wherein the respective rotation and pulling motors are each coupled to an incremental transducer, whose signals are provided to the system controller.

4. The cable rotating head as in claim 2, 3, or 1, wherein the pulling cable is guided through a hollow shaft, which carries the cable rotating head, and wherein the transmission element is rotatably mounted on the hollow shaft.

5. The cable rotating head of in claim 4, wherein the transmission element comprises a double gearwheel having an upper gearwheel and a lower gearwheel, the double gearwheel having two sets of teeth lying one on top of another, the lower gearwheel being coupled to the output shaft of the pulling motor and the upper gearwheel being coupled to an auxiliary shaft of the cable winding mechanism.

6. The cable rotating head of claim 5, wherein the drive connection of the double gearwheel to at least one of the output shaft or the drive shaft has a toothed belt.

7. The cable rotating head of claim 6, further comprising at least one position sensor for determining the cable lift.

8. The cable rotating head of claim 7, further comprising a holder for seed crystals positioned at the end of the pulling cable, wherein the position sensor is configured as a position end switch in the highest position of the holder.

9. The cable rotating head of claim 8, wherein the system controller is configured to ascertain the particular current lift of the holder starting from the highest position of the holder, which is reached as established using the position end switch, and the signals of the incremental transducers.

\* \* \* \* \*